US006215684B1

(12) United States Patent
Rouilhac

(10) Patent No.: US 6,215,684 B1
(45) Date of Patent: Apr. 10, 2001

(54) FEED-THROUGH FOR HIGH AND MEDIUM VOLTAGE STATION

(75) Inventor: Olivier Rouilhac, Dommartin (FR)

(73) Assignee: Alstom Holdings, Paris (FR)

( * ) Notice: Subject to any disclaimer, the term of this patent is extended or adjusted under 35 U.S.C. 154(b) by 0 days.

(21) Appl. No.: 09/463,909

(22) PCT Filed: Jun. 7, 1999

(86) PCT No.: PCT/FR99/01338

§ 371 Date: Feb. 2, 2000

§ 102(e) Date: Feb. 2, 2000

(87) PCT Pub. No.: WO99/65040

PCT Pub. Date: Dec. 16, 1999

(30) Foreign Application Priority Data

Jun. 8, 1998 (FR) .................................................. 98 07178

(51) Int. Cl.$^7$ ............................. H02M 1/00; G01R 15/06

(52) U.S. Cl. ............................................ 363/144; 324/126

(58) Field of Search ............................ 363/144; 324/126; 218/1, 30; 361/104, 62

(56) References Cited

U.S. PATENT DOCUMENTS 4,002,975 * 1/1977 Erickson et al. ....................... 324/96
5,321,221 * 6/1994 Rozier ..................................... 218/2

FOREIGN PATENT DOCUMENTS

3048285 A1 7/1982 (DE) .
3702782 A1 10/1987 (DE) .

* cited by examiner

*Primary Examiner*—Jessica Han
(74) *Attorney, Agent, or Firm*—Sughrue, Mion, Zinn, Macpeak & Seas, PLLC

(57) ABSTRACT

The feedthrough for a high-voltage or medium-voltage substation, including a voltage divider (6), a metal bar (1) extending in a longitudinal direction (D) above the voltage divider and a metal coupling (8) for mechanically and electrically connecting one end of the bar to the voltage divider. The coupling comprises: a flange (9) with a boss (10) fixed to the top of the voltage divider, the boss having a substantially frustoconical bore (11) extending in the longitudinal direction inside which projects a substantially cylindrical central pin (12); and a substantially frustoconical part (13) constituting one end of the bar, this end being split in the longitudinal direction and having a cylindrical central bore (14), the part and the boss being shaped to be inserted one in the other.

1 Claim, 2 Drawing Sheets

FEED-THROUGH FOR HIGH AND MEDIUM VOLTAGE STATION

BACKGROUND OF THE INVENTION

The invention relates to a feedthrough for a high-voltage or medium-voltage substation, including a voltage divider, a metal bar extending in a longitudinal direction above the voltage divider, and a metal coupling for mechanically and electrically connecting one end of the bar to the voltage divider.

A feedthrough of this kind is in particular erected on the ground under a high-voltage or medium-voltage line to pick up the current flowing in the line and, after dividing it, to feed it to protection or measuring equipment. In new generation feedthroughs the voltage divider is in the form of two cylindrical glass blocks separated by a metal electrode and the bar is erected on the top of the divider and rests on it. The mechanical and electrical connection between the bar and the voltage divider must be provided by a metal coupling and the object of the invention is to propose a solution for the manufacture of a coupling of this kind which uses few component parts and whose assembly is simple and reliable.

SUMMARY OF THE INVENTION

To this end, the invention consists in a feedthrough for a high-voltage or medium-voltage substation, including a voltage divider, a metal bar extending in a longitudinal direction above the voltage divider and a metal coupling for mechanically and electrically connecting one end of the bar to the voltage divider, the feedthrough being characterized in that the coupling comprises:

a flange with a boss fixed to the top of the voltage divider, the boss having a substantially frustoconical bore extending in the longitudinal direction inside which projects a substantially cylindrical central pin; and a substantially frustoconical part constituting one end of the bar, this end being split in the longitudinal direction and having a cylindrical central bore, the part and the boss being shaped to be inserted one in the other.

BRIEF DESCRIPTION OF THE DRAWING

The invention will be better understood on reading the following description of an embodiment of the invention shown in the drawings.

DETAILED DESCRIPTION OF THE INVENTION

Figure 1:
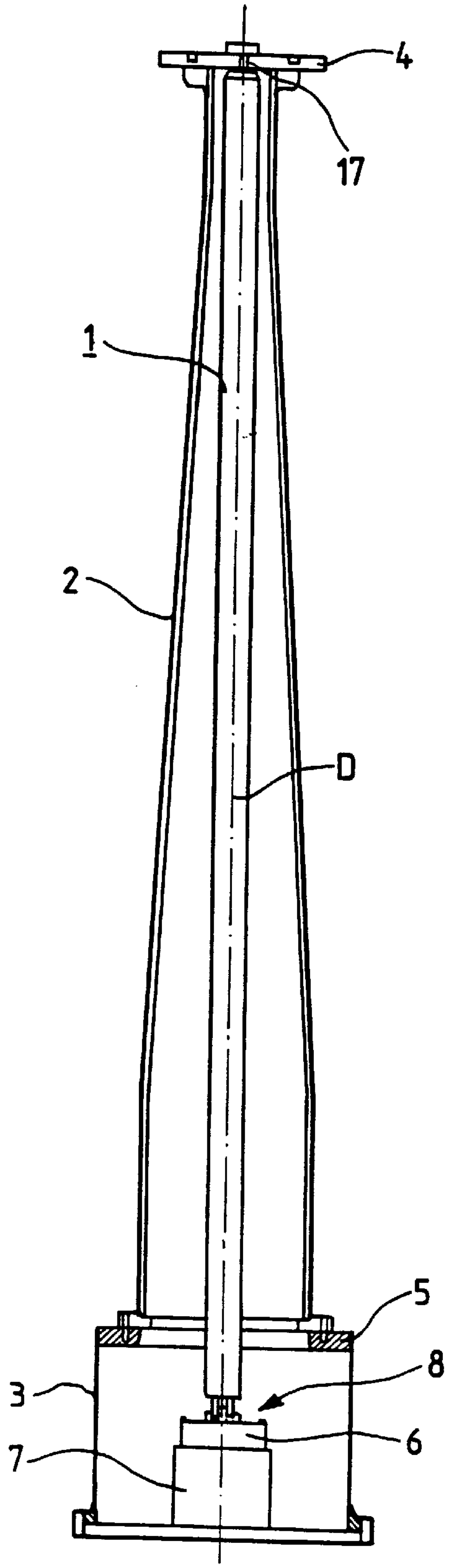
FIG. 1 is a highly schematic axial section view of a feedthrough of the invention.

In FIG. 1, the feedthrough is shown as a support disposed on the ground and extending in a longitudinal and vertical axial direction D. It includes an electrically conductive metal bar 1, for example an aluminum bar, which extends vertically inside a tubular insulative jacket 2. The jacket can be of porcelain, for example. The jacket rests on a metal enclosure 3 resting on the ground. The ends of the jacket are equipped with fittings 4 and 5, the fitting 5 anchoring the jacket to the enclosure. The fitting 4 anchors an electrical line (not shown) to the top of the feedthrough.

The bar 1 is electrically connected to the fitting 4 and to a voltage divider 6 inside the enclosure 3 on an earthed metal support 7. The voltage divider 6 is made up of two cylindrical glass blocks stacked one on the other and separated by an electrode, not shown.

The bar 1 enters the interior of the enclosure 3 and its bottom end rests on the top of the voltage divider 6. A metal coupling 8 connects the bar and the voltage divider electrically and mechanically.

Figure 2:
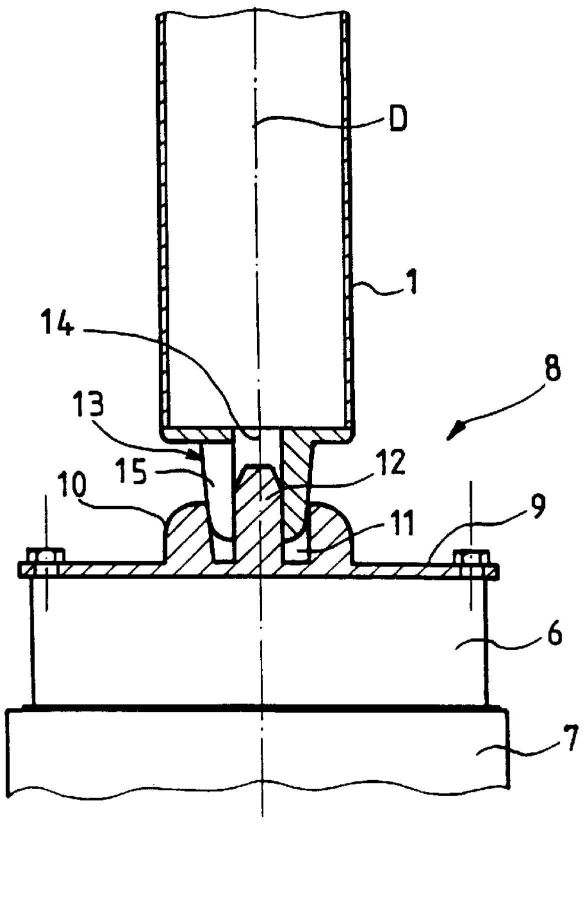
FIG. 2 is a more detailed axial section of the metal coupling between the bar and the voltage divider.

As shown in FIG. 2, the metal coupling 8 comprises a metal flange 9 which is fixed to the top face of the voltage divider. The flange has a central boss 10 in which there is a substantially frustoconical bore 11 extending in the longitudinal direction, together with a substantially cylindrical central pin 12 extending in the axial direction D. The frustoconical bore 11 forms a kind of annular groove whose bottom is narrower than its mouth, the groove thus surrounds the central pin 12 which projects towards the bar in the direction D.

The coupling also has a substantially frustoconical part 13 which constitutes the end of the bar 1 in contact with the voltage divider. The part 13 is split in the direction D and is adapted to be inserted into the bore 11 in the flange. It has its own substantially cylindrical central bore 14 which extends in the axial direction D and in which the pin 12 engages.

The part 13 and the flange 9 are designed to be inserted one in the other with some resistance to insertion so as to assure a good electrical contact and an interference fit perpendicular to the direction D. In particular, the branches 15 of the frustoconical part must bear resiliently on the wall of the bore 11 when the part 13 is engaged in the boss 10 and there must be electrical contact between the pin 12 and the wall of the bore 14.

Clearly, the part 13 and the bar 1 are cast or otherwise made in one part, as is the flange 9 with its boss 10.

Figure 3:
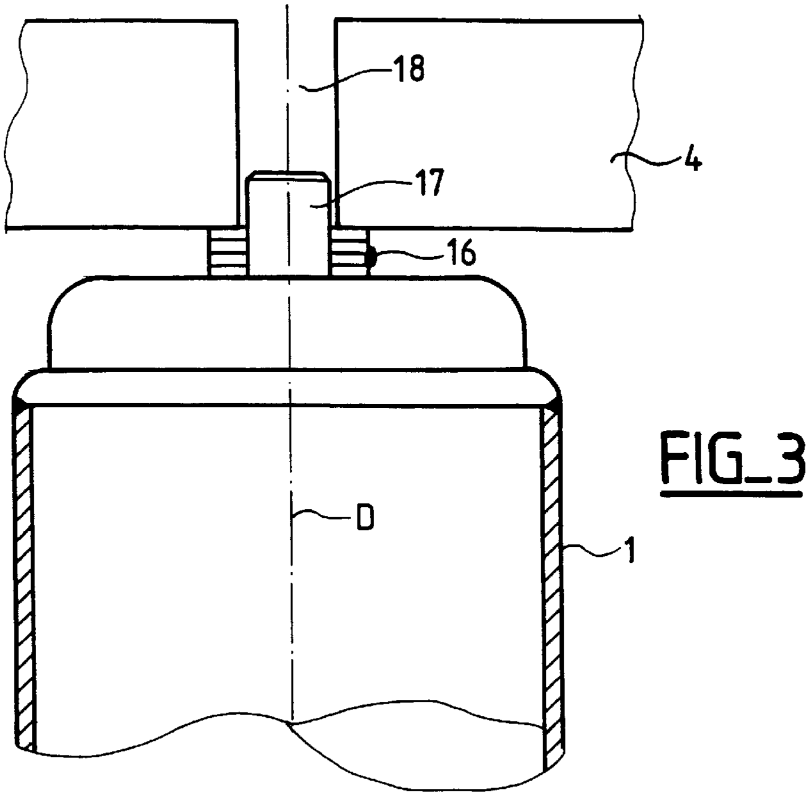
FIG. 3 is a more detailed axial section showing the fixing of the bar to the top of the feedthrough.

As shown in FIG. 3, the bottom end of the bar 1 is pressed against the voltage divider in the direction D by a set of spring washers 16 (or a spiral spring) mounted around a central pin 17 at the top end of the bar 1 to engage in a cylindrical bore 18 in the fitting 4, for example.

The coupling in accordance with the invention therefore does not require the use of an insulative support to hold the bar inside the jacket 2, the mechanical strength of the bar 1 being provided on the one hand by the coupling 8 and on the other hand by the pin 17.

What is claimed is:

1. A feedthrough for one of a high-voltage and a medium-voltage substation, including a voltage divider (6), a metal bar (1) extending in a longitudinal direction (D) above the voltage divider and a metal coupling (8) for mechanically and electrically connecting one end of the bar to the voltage divider, the feedthrough being characterized in that the coupling comprises:

a flange (9) with a boss (10) fixed to a top of the voltage divider, the boss having a substantially frustoconical bore (11) extending in the longitudinal direction and inside of which projects a substantially cylindrical central pin (12); and a substantially frustoconical part (13) constituting the one end of the bar, the one end of the bar being split in the longitudinal direction and having a cylindrical central bore (14), the substantially frustoconical part and the boss being complementary in shape so that the substantially frustoconical part is inserted in the boss.

* * * * *